(12) United States Patent
Lin

(10) Patent No.: US 6,590,463 B2
(45) Date of Patent: Jul. 8, 2003

(54) RC OSCILLATOR CIRCUIT WITH STABLE OUTPUT FREQUENCY

(75) Inventor: Han-Tsun Lin, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/967,560

(22) Filed: Sep. 27, 2001

(65) Prior Publication Data

US 2003/0042987 A1 Mar. 6, 2003

(51) Int. Cl.$^7$ .................................................. H03K 3/26
(52) U.S. Cl. ........................ 331/111; 331/41; 331/140; 327/291
(58) Field of Search ........................ 331/111, 41, 107 R, 331/108 R, 108 C, 108 D, 140, 143, 150, 185; 327/101, 105, 113, 114, 291

(56) References Cited

U.S. PATENT DOCUMENTS

| | | | | |
|---|---|---|---|---|
| 4,131,807 A | * | 12/1978 | Korver | 327/136 |
| 5,250,914 A | * | 10/1993 | Kondo | 331/111 |
| 5,532,653 A | * | 7/1996 | Adkins | 331/143 |
| 5,668,508 A | * | 9/1997 | Pulvirenti et al. | 331/111 |
| 5,699,024 A | * | 12/1997 | Manlove et al. | 331/111 |
| 5,739,728 A | * | 4/1998 | Kim | 331/111 |
| 5,760,655 A | * | 6/1998 | Roohparvar | 331/111 |
| 5,870,000 A | * | 2/1999 | Matsuda et al. | 331/34 |
| 6,060,955 A | * | 5/2000 | Thomsen | 331/111 |
| 6,163,225 A | * | 12/2000 | Sundaram et al. | 331/57 |

* cited by examiner

Primary Examiner—Timothy P. Callahan
Assistant Examiner—Hai L. Nguyen
(74) Attorney, Agent, or Firm—J.C. Patents

(57) ABSTRACT

A RC oscillator circuit with a stable output frequency, having an oscillating integrated circuit working under an operation voltage, the resistor, a first capacitor, a second capacitor, and a transistor. The first and second capacitors construct a RC circuit. The resistor has first and second terminals coupled to output and input terminals of the oscillating integrated device, respectively. The first capacitor has first and second terminals coupled to the input terminal of the oscillating integrated device and the second terminal of the resistor, respectively. The second capacitor has first and second terminals coupled to the second terminal of the first capacitor and ground, respectively. The transistor has a gate coupled to the operation voltage, a drain coupled to the first terminal of the second capacitor, and a grounded source. The RC oscillator circuit with a modulable frequency can work under difference operation voltages and output the same frequency.

16 Claims, 4 Drawing Sheets

RC OSCILLATOR CIRCUIT WITH STABLE OUTPUT FREQUENCY

BACKGROUND OF THE INVENTION

1. Field of the Invention

The invention relates in general to a RC oscillator circuit, and more particularly, to a RC oscillator circuit with a stable output frequency.

2. Description of the Related Art

The RC oscillator circuit has been very broadly applied in the modern technique. In FIG. 1, a conventional RC oscillator circuit includes an oscillator 102, a resistor 104, and a capacitor 106. The oscillator 102 generates a pulse under an operation voltage. Such pulse generates a RC circuit comprised of the resistor 104 and the capacitor 106. The RC circuit has a time constant, according to which the pulse is attenuated. The oscillator 102 has an input terminal coupled between the resistor 104 and the capacitor to receive the attenuated pulse. When the voltage level of the attenuated pulse is less than a critical point, the oscillator 102 generates another pulse. According to the same mechanism, a series of pulse signals is generated with an output frequency. Based on the above mechanism, the output frequency is affected by the resistor 104 and the capacitor 106. Thus, the period or frequency of the pulse signal is changed as the design of RC time constant of the RC circuit to generate an operation frequency.

The output operation frequency of the conventional RC oscillator circuit is changed according to operation voltage of the oscillator 102. The typical operation voltage is the chip operation voltage of 3V or 5V. When the operation voltage is higher, the output operation frequency is higher. That is, the change of operation frequency is related to the operation voltage. Thus, the operation frequency is different under different operation voltage.

In the practical operation, the same output frequency is required when the RC circuit is operated under different operation voltage. However, the conventional circuit has the output frequency increases as the operation voltage. Once the oscillator circuit is operated under different operation voltage, the output frequency is changed. In the conventional oscillator circuit, the output frequency is inversely proportional to the RC time constant. When the output frequency has to be the same, the resistance or capacitance has to be changed to change the RC time constant, so as to adjust the output frequency to be the same. Such application is very complex. When the resistor and the capacitor is invariable, that is, when the resistance or the capacitance is invariable, the oscillator circuit has to be designed with different set of resistor and capacitor. Thus, in the conventional circuit, a certain set of resistor and capacitor is required for the oscillator circuit is under a predetermined operation voltage to obtain the predetermined RC time constant. Such design is very inconvenient for practical application.

SUMMARY OF THE INVENTION

The invention provides a RC oscillator circuit with a stable output frequency to resolve the problem of generating different output frequency due to different operation voltage.

The RC oscillator circuit with a stable output frequency includes the same set of resistor and capacitor to output the same frequency under different operation voltages.

The oscillator circuit with a stable output frequency includes an oscillating integrated device, a resistor, a first capacitor, a second capacitor and a MOS transistor. The oscillating integrated circuit works under an operation voltage to generate a pulse, so as to drive the resistor. The first and second capacitors construct a RC circuit. The resistor has a first terminal and a second terminal coupled to the output and input terminals of the oscillating integrated device, respectively. The first capacitor has a first terminal coupled to the input terminal of the oscillating integrated device and a second terminal coupled to the second terminal of the resistor. The second capacitor has a first terminal coupled to the second terminal of the first capacitor and a second terminal coupled to a ground voltage. The transistor has a gate coupled to the operation voltage, a drain coupled to the first terminal of the second capacitor and a source coupled to ground.

The above operation voltage includes a voltage of about 3V or 5V.

The above oscillating integrated device includes an oscillator.

The above oscillating integrated device includes a pulse generator.

The above MOS transistor is built in the oscillating integrated device.

Both the foregoing general description and the following detailed description are exemplary and explanatory only and are not restrictive of the invention, as claimed.

DESCRIPTION OF THE PREFERRED EMBODIMENTS

To have a RC oscillator circuit output the same frequency under different operation voltage, the invention provides a RC oscillator circuit with a stable output frequency. The capacitor portion includes an upper capacitor and a lower capacitor serially connected to each other. The lower capacitor includes one terminal coupled to a ground voltage. A MOS transistor is coupled to the lower capacitor in parallel with a gate coupled to an operation voltage. When the operation voltage is a high voltage to turn on and ground the MOS transistor. Thus, the capacitance of the circuit is determined to the capacitance of the upper capacitor. When the operation voltage is low, the MOS transistor is turned off. A small capacitance is obtained from the lower and upper capacitors. Thereby, the output frequency is compensated and independent of the operation voltage. Embodiments are provided as follows to give a detailed description of the invention.

Figure 2:
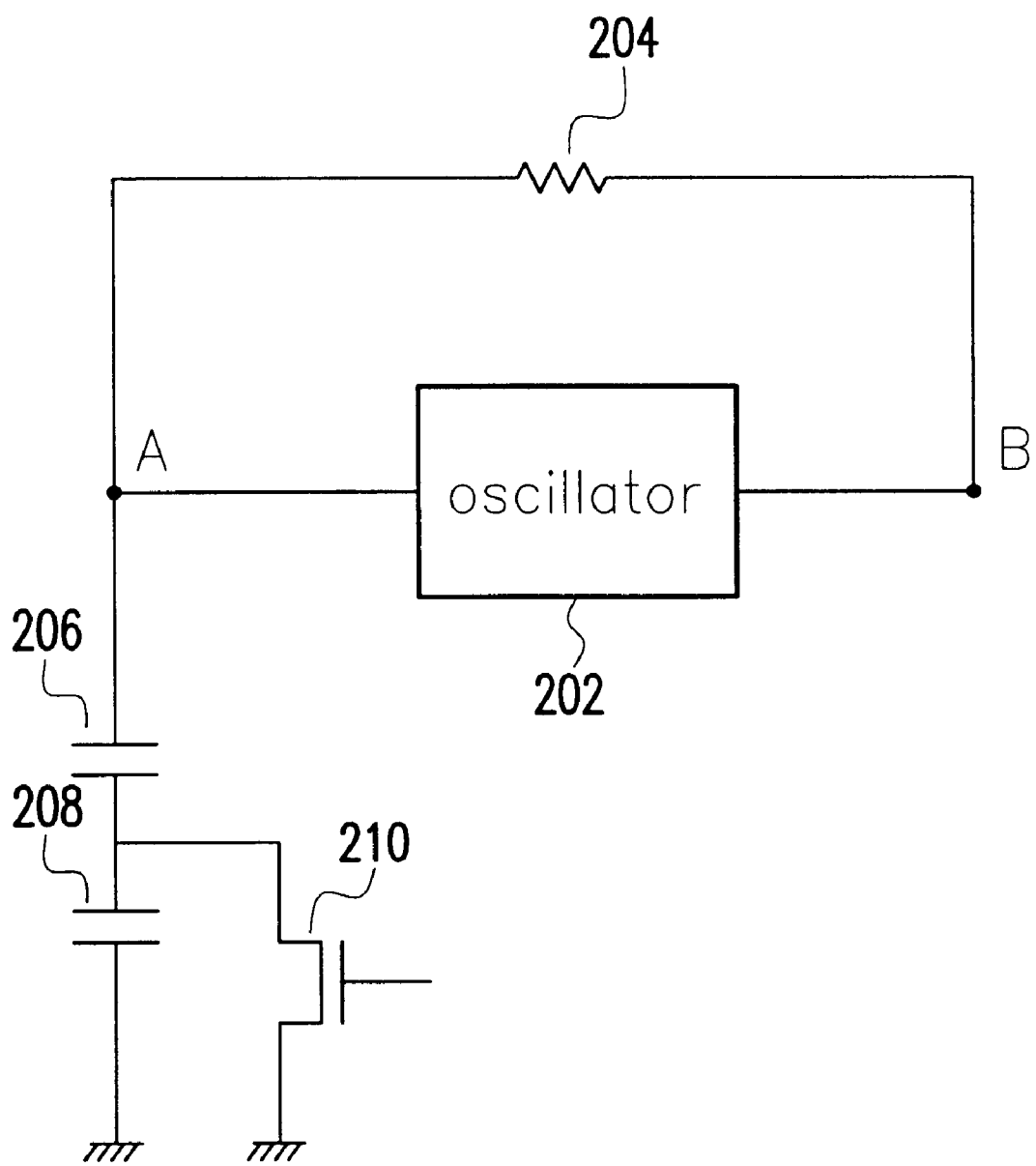
FIG. 2 shows an embodiment of a RC oscillator circuit with a stable output frequency according to the invention.

FIG. 2 shows an embodiment of a RC oscillator circuit with a stable output frequency according to the invention. In the invention, the RC oscillator circuit has a modulable frequency. That is, the RC oscillator circuit uses the same set of resistor and capacitor to output the same frequency under different operation voltage. The RC oscillator circuit with a stable output frequency includes an oscillator 202, a resistor 204, a first capacitor 206, a second capacitor 208, and a MOS transistor 210. The oscillator 202 is only an example of the invention. Any integrated circuit able to generate a pulse or an oscillating integrated device can also be applied to the RC oscillator circuit of the invention. The resistor 204, the first capacitor 206 and the second capacitor 208 construct a RC circuit.

In addition, the oscillator 202 has an output terminal B to output a pulse signal. The resistor 204 has a first terminal and a second terminal coupled to the output terminal B and an input terminal A of the oscillator 202, respectively. The first capacitor 206 has a first terminal coupled to the input terminal A. The second capacitor 208 has a first terminal coupled to a second terminal of the first capacitor 206 and a second terminal coupled to a ground voltage. The transistor 210 has a gate coupled to an operation voltage, a drain coupled to the first terminal of the second capacitor 208, and a source coupled to ground. The operation voltage of the oscillator 202 includes a to system voltage such as 3V or 5V, for example, and the threshold voltage is in between.

Compared to the conventional RC oscillator circuit, the invention has one more capacitor 208 and an additional transistor 210. The control voltage of the gate of the transistor 210 is the same of the operation voltage. That is, in this embodiment, when the operation voltage is 5V, the control voltage is 5V too.

Figure 1:
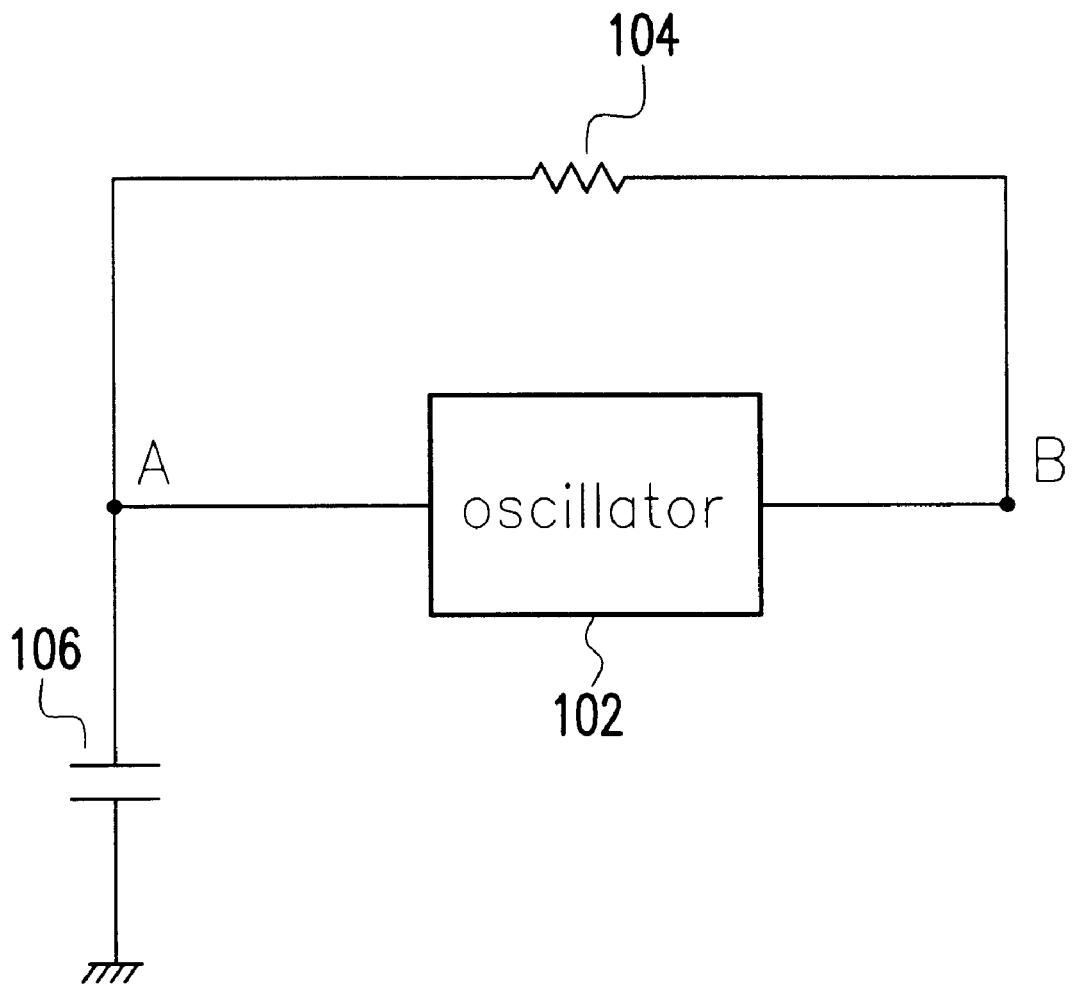
FIG. 1 shows a conventional RC oscillator circuit.

When the operation voltage of the RC oscillator circuit with a stable output frequency is about 5V, a frequency f1 is output. The output mechanical is similar to that as shown in FIG. 1. Since the control voltage of the transistor 210 is the same as the operation voltage of the oscillator 202, the control voltage of the transistor 210 is 5V here. When the transistor 210 is applied with a control voltage of 5V, the transistor is on, so that the current flows through the transistor instead of flowing, through the second capacitor 208. Thus, the second capacitor 208 is ineffective, and the overall RC oscillator circuit is the same as that illustrated in FIG. 1.

When the operation voltage of the RC oscillator circuit is low, that is, when the operation voltage is 3V, a frequency f2 is output. Due to the intrinsic characteristics of the oscillator 202, the frequency f2 is smaller than the frequency f1. As the control voltage of the transistor 210 is the same as the operation voltage of the oscillator 202, the control voltage is 3V too. Being applied with a voltage of 3V, the transistor 210 is off. The current thus flows through the second capacitor 208 without flowing, through the transistor 210. The first capacitor 206 and the second capacitor 208 are thus connected in series to obtain a smaller capacitance. The RC time constant is also smaller. Consequently, a lower output frequency is generated. The lower output frequency caused by the reduced operation voltage is compensated. Thus, the RC oscillator circuit with a stable output frequency can output a stable frequency without being affected by difference of operation voltage. Such circuit can thus be used under different operation voltage to simplify the prior art. In the RC oscillator circuit, the output frequency is inversely proportional to the multiplication of the resistance and the capacitance, that is, the RC time constant, and is proportional to the operation voltage. Therefore, the output frequency of the 3V operation voltage is larger than that of the 5V operation voltage. In this embodiment, the capacitance of the RC oscillator circuit with the operation voltage of 3V is larger than that with the operation of 5V. The output frequency for the 3V operation voltage is pulled up to that same as that for the 5V operation voltage. In this embodiment, the second capacitor is used to adjust the frequency until the output frequency f1 is equal to the output frequency f2.

Figure 4:
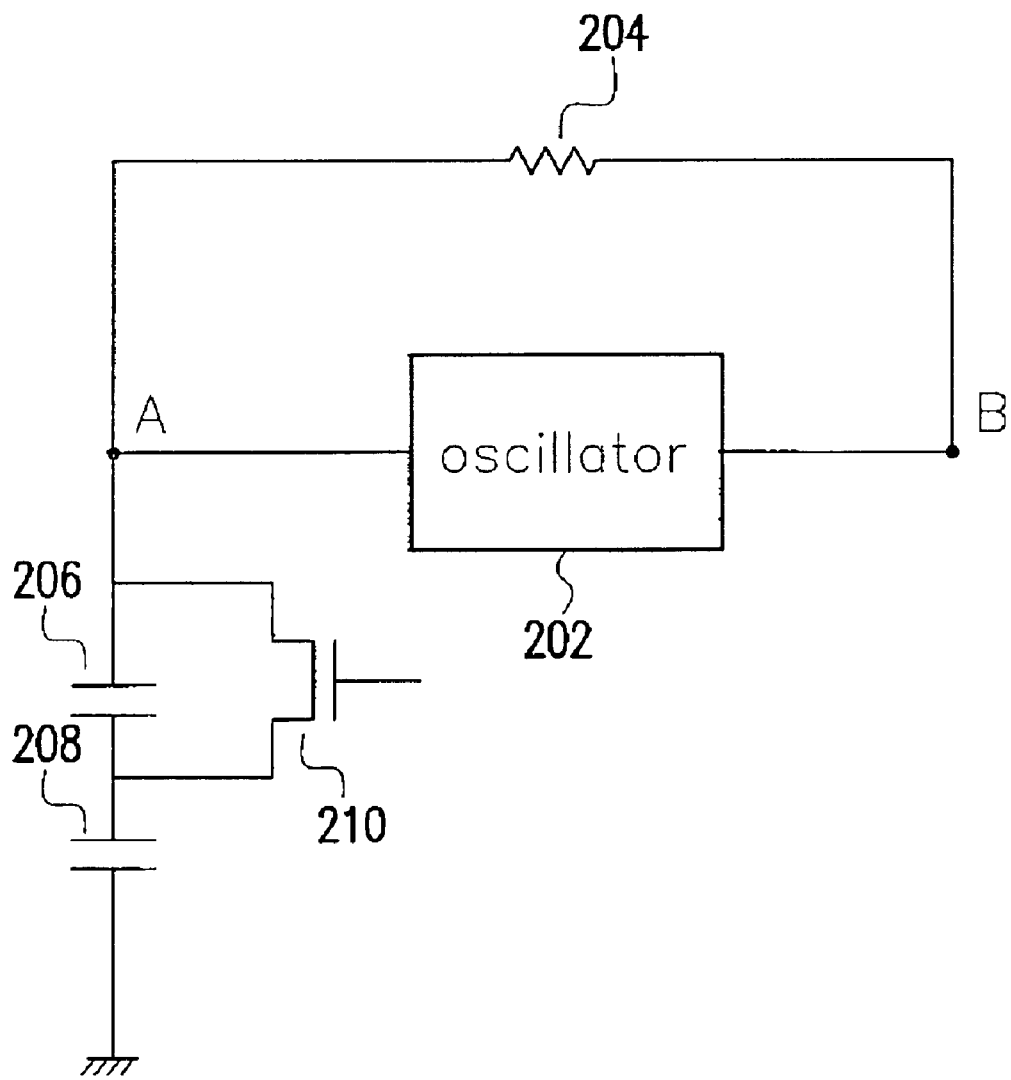
FIG. 4 shows still another embodiment of a RC oscillator circuit with a stable output frequency according to the invention.

The above MOS transistor 210 is connected to the lower capacitor 208 in parallel with the gate controlled by the operation voltage. The MOS transistor 210 can also be connected to the upper capacitor 206 in parallel to control the current flow of the upper capacitor 206. The control mechanism is the same. With the parallel connection as shown in FIG. 4, the source/drain of the transistor 210 is connected to two terminals of the upper capacitor 206. When the transistor 210 is on, the current does not flow through the capacitor 206. When the transistor 206 is off, the current flows through the capacitor 206.

Figure 3:
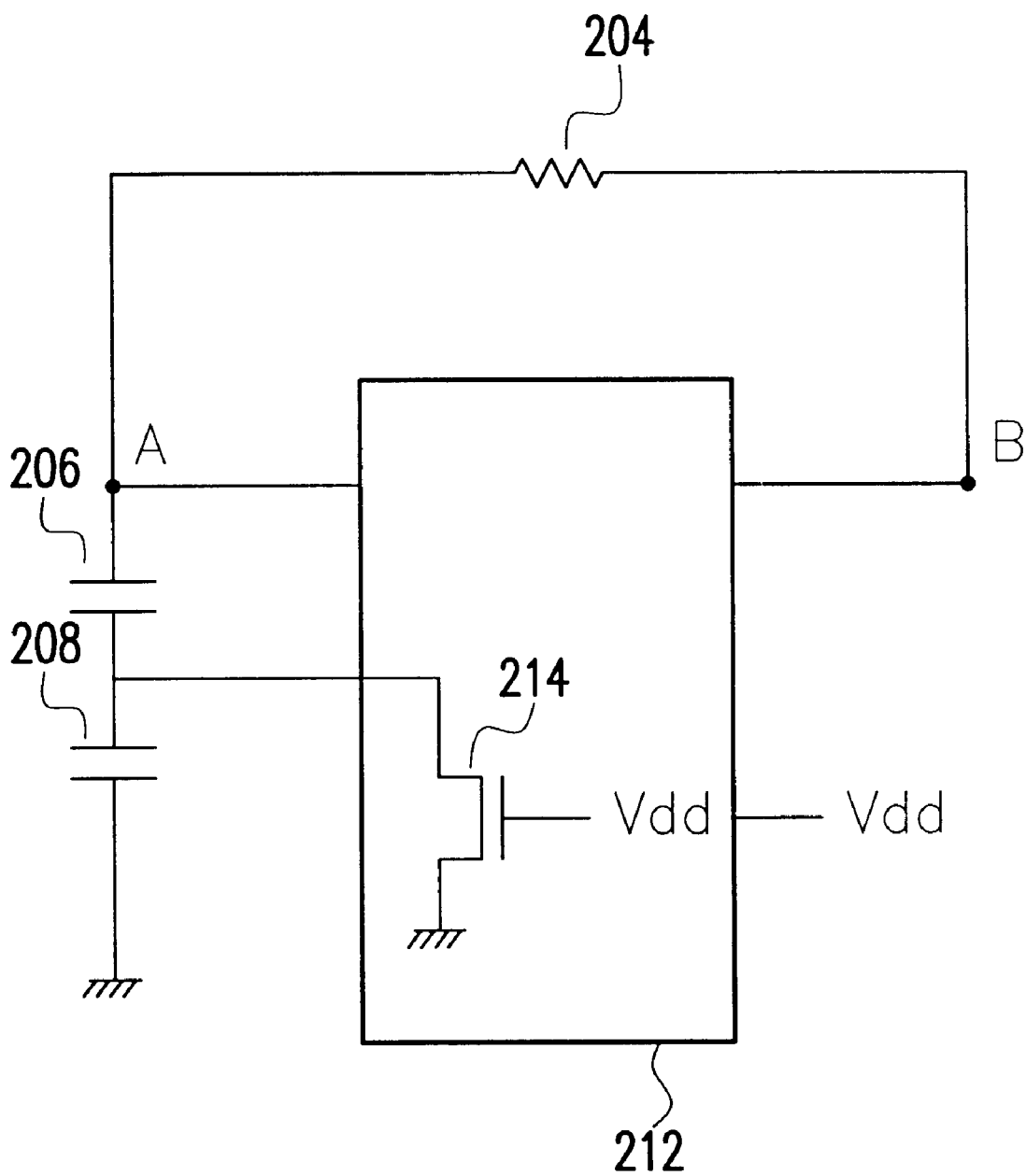
FIG. 3 shows another embodiment of a RC oscillator circuit with a stable output frequency according to the invention.

FIG. 3 shows another embodiment of a RC oscillator circuit with a stable output frequency. The RC oscillator circuit has an oscillator 212 working under an operation voltage Vdd. The oscillator 212 includes a MOS transistor 214 similar to the MOS transistor 210 as shown in FIG. 2. The transistor 214 is built in the oscillator 212, such that the oscillator 212 has an integral circuit.

In addition, the output of the above oscillator is connected to the resistor 204. In fact, the positions of the resistor and the capacitor can be interchanged without affecting the characteristics of the RC circuit. This is purely the change of design.

Accordingly, the RC oscillator circuit can work under different operation voltages to obtain the constant output frequency without changing the capacitance and the resistance (that is, with the fixed resistor 204 and the fixed first capacitor 206). Under the same operation voltage, the RC oscillator circuit of the invention is more stable and reliable compared to the conventional one.

In addition, the oscillator includes other output terminals for other circuit devices according to the output frequency.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A RC oscillator circuit with a stable output frequency, applicable under a different operation voltage, comprising:
    a pulse generating integrated circuit, having an output terminal to generate a pulse signal under the operation voltage;
    a resistor, having a first terminal coupled to the output terminal of the pulse generating integrated circuit and a second terminal coupled to an input terminal of the pulse generating integrated circuit;
    a first capacitor, having a first terminal coupled to the input terminal of the pulse generating integrated circuit;
    a second capacitor, having a first terminal coupled to a second terminal of the first capacitor and a second terminal coupled to a ground voltage; and
    a MOS transistor, having a gate coupled to the operation voltage and connected to one of the first and second capacitors in parallel.

2. The RC oscillator circuit with a stable output frequency according to claim 1, wherein the MOS transistor is connected to the second capacitor in parallel with a drain coupled to the first terminal of the second capacitor, and a source coupled to the ground voltage.

3. The RC oscillator circuit with a stable output frequency according to claim 1, wherein the MOS transistor is coupled to the first capacitor in parallel with a drain coupled to the first terminal of the first capacitor and a source coupled to the second terminal of the first capacitor.

4. The RC oscillator circuit with a stable output frequency according, to claim 1, wherein the operation voltage is between about 1.8V to about 5V.

5. The RC oscillator circuit with a stable output frequency according to claim 1, wherein the pulse generating integrated circuit includes an oscillator.

6. A RC oscillator with a stable output frequency, operable under a different voltage to output a frequency, including:
- a pulse generator, having an output terminal to output a pulse signal with the frequency under the operation voltage;
- a resistor, having a first terminal coupled to the output terminal of the pulse generator, and a second terminal coupled to an input terminal of the pulse generator,
- a first capacitor, having a first terminal coupled to the input terminal of the pulse generator;
- a second capacitor, having a first terminal coupled to the second terminal of the first capacitor and a second terminal coupled to a ground voltage, and
- a MOS transistor, built in the pulse generator with a gate coupled to the operation voltage, the MOS transistor being connected to one of the first and the second capacitors in parallel.

7. The RC oscillator circuit with a stable output frequency according to claim 6, wherein the MOS transistor is connected to the second capacitor in parallel with a drain coupled to the first terminal of the second capacitor, and a source coupled to the ground voltage.

8. The RC oscillator circuit with a stable output frequency according to claim 6, wherein the MOS transistor is coupled to the first capacitor in parallel with a drain coupled to the first terminal of the first capacitor and a source coupled to the second terminal of the first capacitor.

9. The RC oscillator circuit with a stable output frequency according to claim 6, wherein the operation voltage is between about 1.8V to about 5V.

10. The RC oscillator circuit with a stable output frequency according to claim 6, wherein the pulse generating integrated circuit includes an oscillator.

11. A RC oscillator circuit with a stable output frequency, applicable under a different operation voltage to output a frequency, comprising:
- a pulse generating circuit, having an output circuit to generate a pulse signal with the frequency under the operation voltage;
- a RC circuit, including a resistor, a first capacitor, and a second capacitor serially connected, wherein the resistor and a connecting node of the first capacitor are connected to an input terminal of the pulse generating circuit, and the RC circuit is connected between the output terminal of the pulse generating circuit and a ground voltage; and
- a MOS transistor, having a gate connected to the operation voltage, the MOS transistor being connected to one of the first and the second capacitors in parallel.

12. The RC oscillator circuit with a stable output frequency according to claim 11, wherein the MOS transistor is connected to the second capacitor in parallel.

13. The RC oscillator circuit with a stable output frequency according to claim 11, wherein the MOS transistor is coupled to the first capacitor in parallel with a drain coupled to the first terminal of the first capacitor and a source coupled to the second terminal of the first capacitor.

14. The RC oscillator circuit with a stable output frequency according to claim 11, wherein the operation voltage is between about 1.8V to about 5V.

15. The RC oscillator circuit with a stable output frequency according to claim 11, wherein the pulse generating integrated circuit includes an oscillator.

16. The RC oscillator circuit with a stable output frequency according to claim 11, wherein the MOS transistor is built in the pulse generating circuit.

* * * * *